(12) United States Patent
Chen et al.

(10) Patent No.: US 10,483,612 B2
(45) Date of Patent: Nov. 19, 2019

(54) SPLITTER AND ELECTRONIC DEVICE

(71) Applicant: Wistron NeWeb Corp., Hsinchu (TW)

(72) Inventors: Szu-Yuan Chen, Hsinchu (TW); Chiung-Wen Hsin, Hsinchu (TW)

(73) Assignee: WISTRON NEWEB CORP., Hsinchu (TW)

( * ) Notice: Subject to any disclaimer, the term of this patent is extended or adjusted under 35 U.S.C. 154(b) by 0 days.

(21) Appl. No.: 16/115,765

(22) Filed: Aug. 29, 2018

(65) Prior Publication Data
US 2019/0229392 A1    Jul. 25, 2019

(30) Foreign Application Priority Data

Jan. 19, 2018 (TW) .............................. 107102035 A

(51) Int. Cl.
*H01P 5/19*    (2006.01)
*H03H 7/00*    (2006.01)

(52) U.S. Cl.
CPC ................ *H01P 5/19* (2013.01); *H03H 7/00* (2013.01)

(58) Field of Classification Search
CPC .... H01P 5/12; H01P 5/16; H03H 7/00; H03H 7/48
See application file for complete search history.

(56) References Cited

U.S. PATENT DOCUMENTS

| 4,401,955 A * | 8/1983 | Yorinks .................... H01P 5/12 333/127 |
| 6,578,202 B1 * | 6/2003 | Holland ................. H03H 7/482 333/100 |
| 6,980,057 B2 * | 12/2005 | Morimoto ............... H03F 3/265 330/124 R |

(Continued)

FOREIGN PATENT DOCUMENTS

| TW | 201320460 A | 5/2013 |
| TW | 201445802 A | 12/2014 |

(Continued)

OTHER PUBLICATIONS

Chinese language office action dated Jul. 17, 2018, issued in application TW 107102035.
English language translation of Office Action.

*Primary Examiner* — Robert J Pascal
*Assistant Examiner* — Kimberly E Glenn
(74) *Attorney, Agent, or Firm* — McClure, Qualey & Rodack, LLP

(57) ABSTRACT

A splitter includes a common transmission line, a first transmission line, a second transmission line, a third transmission line, a fourth transmission line, a resistor, and a first reactance circuit. The common transmission line is coupled between a common port and a common node. The first transmission line is coupled between a first port and a first node. The second transmission line is coupled between a second port and a second node. The third transmission line (Continued)

is coupled between the common node and the first node. The fourth transmission line is coupled between the common node and the second node. The resistor is coupled between the first node and the second node. The first reactance circuit is coupled between the first node and the second node. The first reactance circuit includes a first inductor and a first capacitor coupled in parallel, but it does not include any resistor.

17 Claims, 5 Drawing Sheets

(56) References Cited

U.S. PATENT DOCUMENTS

| 8,698,576 B2 * | 4/2014 | Hung | H03F 1/52 |
| | | | 333/125 |
| 9,712,131 B2 * | 7/2017 | Thorup | H03H 7/48 |

FOREIGN PATENT DOCUMENTS

| TW | 201618458 A | 5/2016 |
| TW | 201624823 A | 7/2016 |

* cited by examiner

SPLITTER AND ELECTRONIC DEVICE

CROSS REFERENCE TO RELATED APPLICATIONS

This Application claims priority of Taiwan Patent Application No. 107102035 filed on Jan. 19, 2018, the entirety of which is incorporated by reference herein.

BACKGROUND OF THE INVENTION

Field of the Invention

The disclosure generally relates to a splitter, and more particularly, it relates to a splitter for reducing isolation.

Description of the Related Art

A conventional 2-to-1 splitter has one common port and two output ports. Generally, the two output ports usually have extremely high isolation therebetween. However, for some specific applications, the aforementioned high isolation limits signal transmission between the output ports, and it is considered as a disadvantage of the conventional splitter. Accordingly, there is a need to proposed a novel solution for solving the problems of the prior art.

BRIEF SUMMARY OF THE INVENTION

In an exemplary embodiment, the disclosure is directed to a splitter with a common port, a first port, and a second port. The splitter includes a common transmission line, a first transmission line, a second transmission line, a third transmission line, a fourth transmission line, a resistor, and a first reactance circuit. The common transmission line is coupled between the common port and a common node. The first transmission line is coupled between the first port and a first node. The second transmission line is coupled between the second port and a second node. The third transmission line is coupled between the common node and the first node. The fourth transmission line is coupled between the common node and the second node. The resistor is coupled between the first node and the second node. The first reactance circuit is coupled between the first node and the second node. The first reactance circuit includes a first inductor and a first capacitor coupled in parallel, but the first reactance circuit does not include any resistor.

In another exemplary embodiment, the disclosure is directed to an electronic device including a signal source and a splitter. The splitter has a common port coupled to the signal source, a first port, and a second port. The splitter includes a common transmission line, a first transmission line, a second transmission line, a third transmission line, a fourth transmission line, a resistor, and a first reactance circuit. The common transmission line is coupled between the common port and a common node. The first transmission line is coupled between the first port and a first node. The second transmission line is coupled between the second port and a second node. The third transmission line is coupled between the common node and the first node. The fourth transmission line is coupled between the common node and the second node. The resistor is coupled between the first node and the second node. The first reactance circuit is coupled between the first node and the second node. The first reactance circuit includes a first inductor and a first capacitor coupled in parallel, but the first reactance circuit does not include any resistor.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are shown in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1:
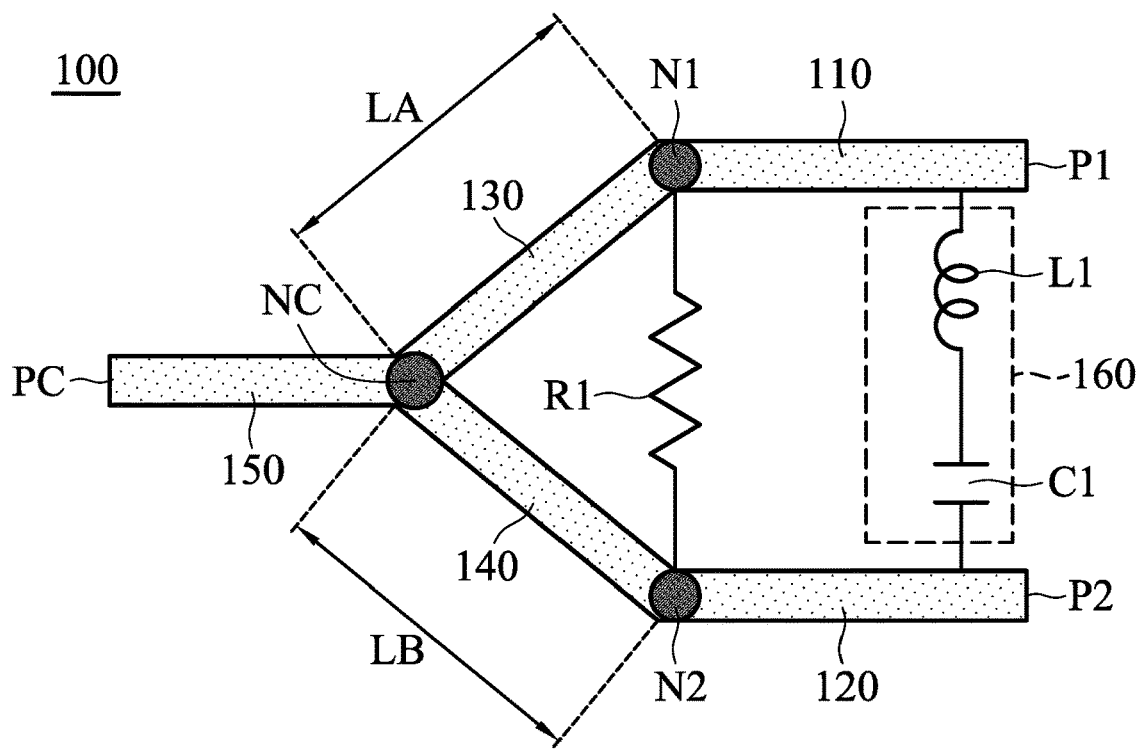
FIG. 1 is a diagram of a splitter according to an embodiment of the invention.

FIG. 1 is a diagram of a splitter 100 according to an embodiment of the invention. The splitter 100 can be configured to combine or divide signals. As shown in FIG. 1, the splitter 100 has a first port P1, a second port P2, and a common port PC. In some embodiments, the common port PC is used as a common input port, the first port P1 is used as a first output port, and the second port P2 is used as a second output port. For example, the signal received by the common port PC may be divided into two portions, and the two portions may be outputted from the first port P1 and the second port P2, respectively. However, the invention is not limited to the above. In other embodiments, any of the first port P1, the second port P2, and the common port PC may be used as an input port, an output port, or their combination (i.e., an input/output port).

In the embodiment of FIG. 1, the splitter 100 includes a first transmission line 110, a second transmission line 120, a third transmission line 130, a fourth transmission line 140, a common transmission line 150, a resistor R1, and a first reactance circuit 160. A first end of the first transmission line 110 is coupled to the first port P1, and a second end of the first transmission line 110 is coupled to a first node N1, such that the first transmission line 110 is coupled between the first port P1 and the first node N1. A first end of the second transmission line 120 is coupled to the second port P2, and a second end of the second transmission line 120 is coupled to a second node N2, such that the second transmission line 120 is coupled between the second port P2 and the second node N2. A first end of the third transmission line 130 is coupled to a common node NC, and a second end of the third transmission line 130 is coupled to the first node N1, such that the third transmission line 130 is coupled between the common node NC and the first node N1. A first end of the fourth transmission line 140 is coupled to the common node NC, and a second end of the fourth transmission line 140 is coupled to the second node N2, such that the fourth transmission line 140 is coupled between the common node NC and the second node N2. A first end of the common transmission line 150 is coupled to the common port PC, and a second end of the common transmission line 150 is coupled to the common node NC, such that the common transmission line 150 is coupled between the common port PC and the common node NC. The shapes, lengths, and types of the first transmission line 110, the second transmission line 120, the third transmission line 130, the fourth transmission line 140, and the common transmission line 150 are not limited in the invention. For example, any of the first transmission line 110, the second transmission line 120, the third transmission line 130, the fourth transmission line 140, and the common transmission line 150 may be a microstrip line, a stripline, or a CPW (Coplanar Waveguide), but it is not limited thereto.

The resistor R1 is coupled between the first node N1 and the second node N2. The resistor R1 may be a general resistor, a variable resistor, or a chip resistor. It should be noted that although it seems that the first reactance circuit 160 and the resistor R1 displayed in FIG. 1 have different connection points, in fact, the first reactance circuit 160 is also coupled between the first node N1 and the second node N2, such that the first reactance circuit 160 is coupled in parallel with the resistor R1. The first reactance circuit 160 includes a first inductor L1 and a first capacitor C1 which are coupled in series. However, the first reactance circuit 160 does not include any resistor. The first inductor L1 may be a general inductor, a variable inductor, or a chip inductor. The first capacitor C1 may be a general capacitor, a variable capacitor, or a chip capacitor.

Figure 2:
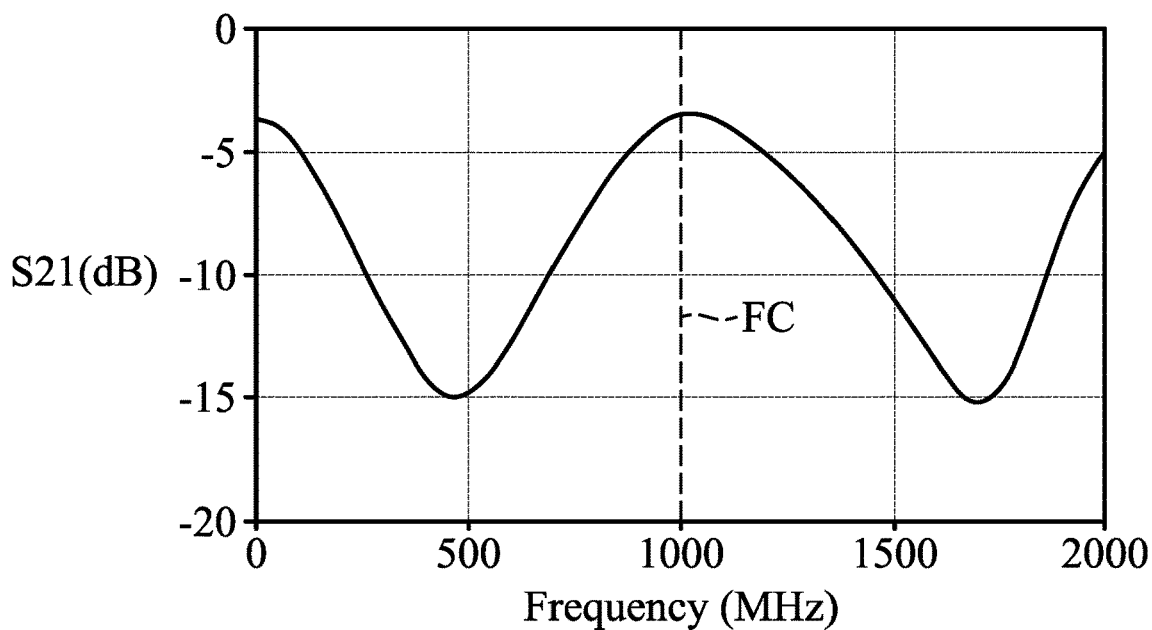
FIG. 2 is a diagram of isolation between a first port and a second port of a splitter according to an embodiment of the invention.

FIG. 2 is a diagram of the isolation between the first port P1 and the second port P2 of the splitter 100 according to an embodiment of the invention. The horizontal axis represents the operation frequency (MHz), and the vertical axis represents the S21 (or S12) parameter between the first port P1 and the second port P2. According to the measurement of FIG. 2, the splitter 100 has a central frequency FC, and the first reactance circuit 160 is configured to reduce the isolation between the first port P1 and the second port P2 at the central frequency FC. The aforementioned central frequency FC is adjustable according to different requirements, and it is not limited to 1 GHz. In some embodiments, the first inductor L1 and the first capacitor C1 are set according to the equation (1).

$$FC = \frac{1}{2\pi} \cdot \frac{1}{\sqrt{L1 \cdot C1}} \quad (1)$$

where "FC" represents the central frequency FC, "π" represents a circular constant, "L1" represents the inductance of the first inductor L1, and "C1" represents the capacitance of the first capacitor C1.

The operation principle of the splitter 100 may be as follows. If the splitter 100 operates at the central frequency FC, the first inductor L1 and the first capacitor C1 of the first reactance circuit 160 will be almost equivalent to a short-circuited path, such that the impedance value between the first node N1 and the second node N2 will be substantially equal to 0. With such a design, the first node N1 and the second node N2 are almost directly connected to each other, and therefore the isolation and the IL (Insertion Loss) between the first port P1 and the second port P2 (each of the isolation and the IL is usually equal to the absolute value of the S21 parameter) can be 3 dB or lower. In other words, the signal received by the first port P1 can be easily outputted to the second port P2, and the signal received by the second port P2 can be easily outputted to the first port P1. There is not so much signal transmission loss between the first port P1 and the second port P2. It should be noted that the first reactance circuit 160 does not include any resistor. Such a design can prevent the isolation between the first port P1 and the second port P2 from being significantly increased because of the loss of the resistor. On the other hand, if the splitter 100 does not operate at the central frequency FC, the first inductor L1 and the first capacitor C1 of the first reactance circuit 160 will generate a sufficiently high impedance value, so as to maintain high isolation between the first port P1 and the second port P2 at other frequencies (other than the central frequency FC).

In some embodiments, the element sizes of the splitter 100 are as follows. The length LA of the third transmission line 130 may be substantially equal to 0.25 wavelength (λ/4) of the central frequency FC. The length LB of the fourth transmission line 140 may be substantially equal to 0.25 wavelength (λ/4) of the central frequency FC. The common transmission line 150, the first transmission line 110, and the second transmission line 120 may each have substantially the same predetermined impedance value (Z). The impedance value of the third transmission line 130 may be substantially equal to √2 times the predetermined impedance value (√2·Z). The impedance value of the fourth transmission line 140 may be substantially equal to √2 times the predetermined impedance value (√2·Z). The resistance of the resistor R1 may be substantially 2 times the predetermined impedance value (2·Z). The above element parameters are calculated and obtained according to many experiment results, and they help to optimize the impedance matching of the splitter 100.

Figure 3:
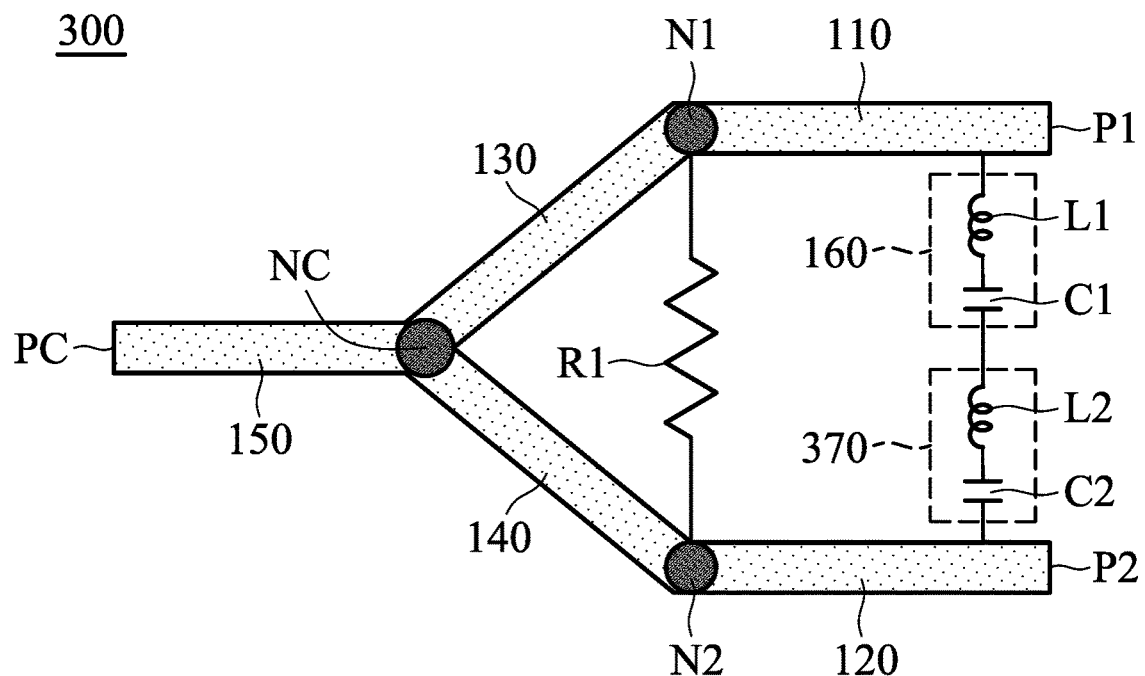
FIG. 3 is a diagram of a splitter according to another embodiment of the invention.

FIG. 3 is a diagram of a splitter 300 according to another embodiment of the invention. FIG. 3 is similar to FIG. 1. In the embodiment of FIG. 3, the splitter 300 further includes a second reactance circuit 370. The second reactance circuit 370 and the first reactance circuit 160 are coupled in series between the first node N1 and the second node N2. The second reactance circuit 370 includes a second inductor L2 and a second capacitor C2 which are coupled in series. However, the second reactance circuit 370 does not include any resistor. The second inductor L2 may be a general inductor, a variable inductor, or a chip inductor. The second capacitor C2 may be a general capacitor, a variable capacitor, or a chip capacitor.

Figure 4:
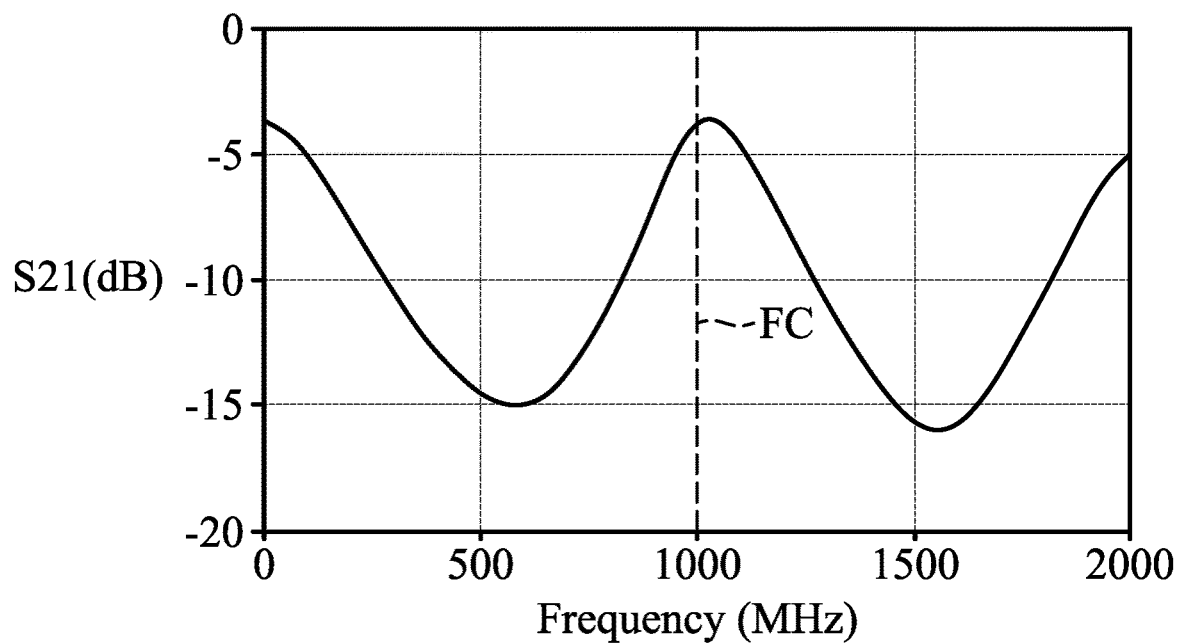
FIG. 4 is a diagram of isolation between a first port and a second port of a splitter according to another embodiment of the invention.

FIG. 4 is a diagram of the isolation between the first port P1 and the second port P2 of the splitter 300 according to another embodiment of the invention. The horizontal axis represents the operation frequency (MHz), and the vertical axis represents the S21 (or S12) parameter between the first port P1 and the second port P2. According to the measurement of FIG. 4, the splitter 300 has a central frequency FC. The first reactance circuit 160 and the second reactance circuit 370 are configured to reduce the isolation between the first port P1 and the second port P2 at the central frequency FC, and enhance the isolation between the first port P1 and the second port P2 at the other frequencies, which are adjacent to the central frequency FC but are different from the central frequency FC. The aforementioned central frequency FC is adjustable according to different requirements, and it is not limited to 1 GHz. In some embodiments, the second inductor L2 and the second capacitor C2 are set according to the equations (2) and (3).

$$FC = \frac{1}{2\pi} \cdot \frac{1}{\sqrt{L2 \cdot C2}} \qquad (2)$$

$$L2 \cdot C2 = L1 \cdot C1 \qquad (3)$$

where "FC" represents the central frequency FC, "π" represents the circular constant, "L2" represents the inductance of the second inductor L2, "C2" represents the capacitance of the second capacitor C2, "L1" represents the inductance of the first inductor L1, and "C1" represents the capacitance of the first capacitor C1.

With such a design, the first reactance circuit 160 and the second reactance circuit 370 have the same resonant frequency. When the first reactance circuit 160 is coupled in series with the second reactance circuit 370, the isolation becomes higher at frequencies other than the central frequency FC. Therefore, the splitter 300 can provide higher frequency selectivity. Other features of the splitter 300 of FIG. 3 are similar to those of the splitter 100 of FIG. 1. Accordingly, the two embodiments can achieve similar levels of performance.

Figure 5:
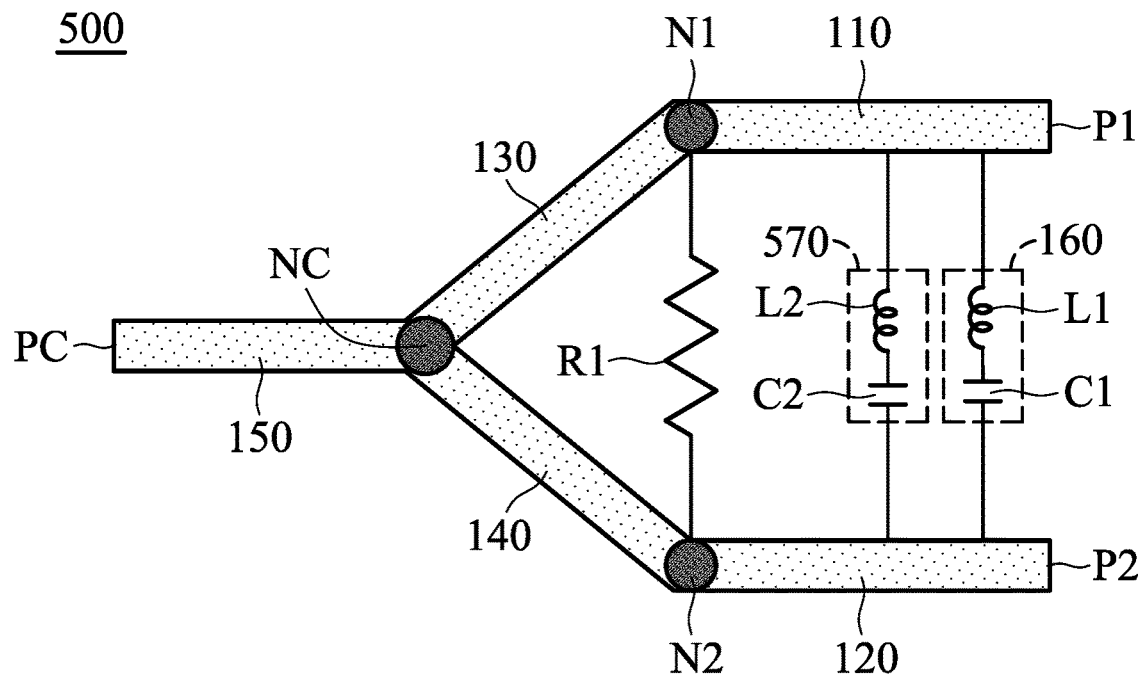
FIG. 5 is a diagram of a splitter according to another embodiment of the invention.

FIG. 5 is a diagram of a splitter 500 according to another embodiment of the invention. FIG. 5 is similar to FIG. 1. In the embodiment of FIG. 5, the splitter 500 further includes a second reactance circuit 570. The second reactance circuit 570 and the first reactance circuit 160 are coupled in parallel between the first node N1 and the second node N2. It should be noted that although it seems that the second reactance circuit 570 and the resistor R1 displayed in FIG. 5 have different connection points, in fact, the second reactance circuit 570 is also coupled between the first node N1 and the second node N2, such that the second reactance circuit 570 is coupled in parallel with the resistor R1. The second reactance circuit 570 includes a second inductor L2 and a second capacitor C2 which are coupled in series. However, the second reactance circuit 570 does not include any resistor. The second inductor L2 may be a general inductor, a variable inductor, or a chip inductor. The second capacitor C2 may be a general capacitor, a variable capacitor, or a chip capacitor.

Figure 6:
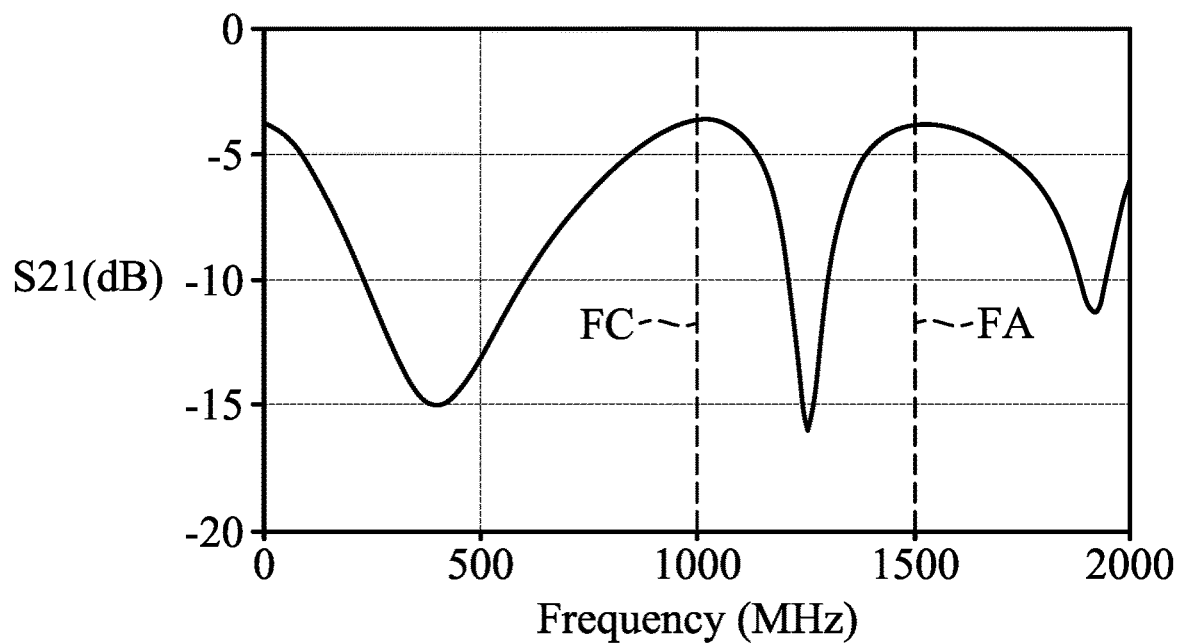
FIG. 6 is a diagram of isolation between a first port and a second port of a splitter according to another embodiment of the invention.

FIG. 6 is a diagram of the isolation between the first port P1 and the second port P2 of the splitter 500 according to another embodiment of the invention. The horizontal axis represents the operation frequency (MHz), and the vertical axis represents the S21 (or S12) parameter between the first port P1 and the second port P2. According to the measurement of FIG. 6, the splitter 500 further has an additional frequency FA other than a central frequency FC. The first reactance circuit 160 is configured to reduce the isolation between the first port P1 and the second port P2 at the central frequency FC. The second reactance circuit 570 is configured to reduce the isolation between the first port P1 and the second port P2 at the additional frequency FA. For example, the additional frequency FA may be substantially 1 to 2 times the central frequency FC, such as 1.5 times the central frequency FC. The aforementioned central frequency FC and additional frequency FA are adjustable according to different requirements, and they are not limited to 1 GHz and 1.5 GHz. In some embodiments, the second inductor L2 and the second capacitor C2 are set according to the equations (4) and (5).

$$FA = \frac{1}{2\pi} \cdot \frac{1}{\sqrt{L2 \cdot C2}} \qquad (4)$$

$$L2 \cdot C2 \neq L1 \cdot C1 \qquad (5)$$

where "FA" represents the additional frequency FA, "π" represents the circular constant, "L2" represents the inductance of the second inductor L2, "C2" represents the capacitance of the second capacitor C2, "L1" represents the inductance of the first inductor L1, and "C1" represents the capacitance of the first capacitor C1.

With such a design, the first reactance circuit 160 and the second reactance circuit 570 have different resonant frequencies. When the first reactance circuit 160 is coupled in parallel with the second reactance circuit 570, the isolation becomes lower at both the central frequency FC and the additional frequency FA. Therefore, the splitter 500 can provide larger transmission bandwidth. Other features of the splitter 500 of FIG. 5 are similar to those of the splitter 100 of FIG. 1. Accordingly, the two embodiments can achieve similar levels of performance.

Figure 7:
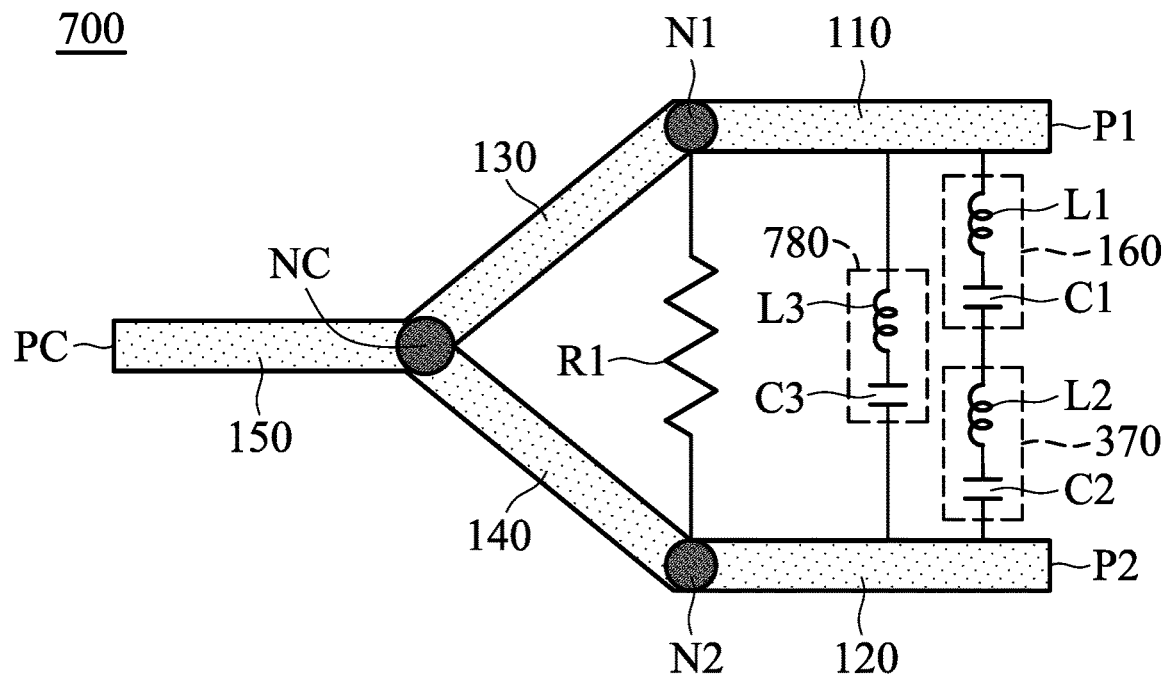
FIG. 7 is a diagram of a splitter according to another embodiment of the invention.

FIG. 7 is a diagram of a splitter 700 according to another embodiment of the invention. FIG. 7 is similar to FIG. 3. In the embodiment of FIG. 7, the splitter 700 further includes a third reactance circuit 780. The third reactance circuit 780 is coupled in parallel with the first reactance circuit 160 and the second reactance circuit 370 between the first node N1 and the second node N2. It should be noted that although it seems that the third reactance circuit 780 and the resistor R1 displayed in FIG. 7 have different connection points, in fact, the third reactance circuit 780 is also coupled between the first node N1 and the second node N2, such that the third reactance circuit 780 is coupled in parallel with the resistor R1. The third reactance circuit 780 includes a third inductor L3 and a third capacitor C3 which are coupled in series. However, the third reactance circuit 780 does not include any resistor. The third inductor L3 may be a general inductor, a variable inductor, or a chip inductor. The third capacitor C3 may be a general capacitor, a variable capacitor, or a chip capacitor.

Figure 8:
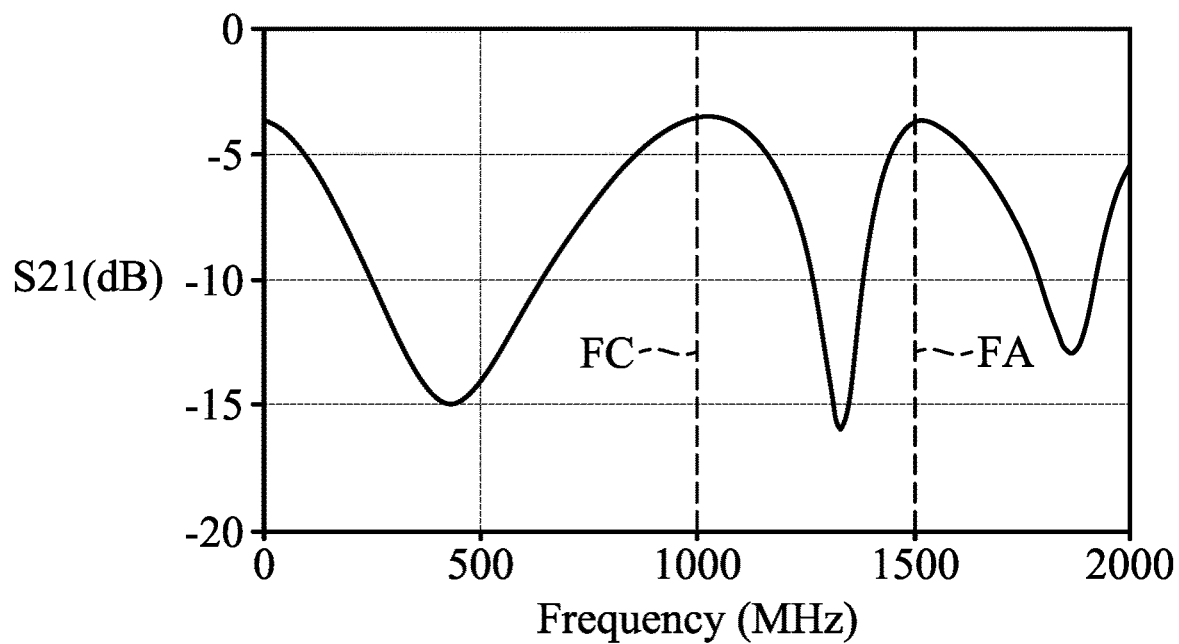
FIG. 8 is a diagram of isolation between a first port and a second port of a splitter according to another embodiment of the invention.

FIG. 8 is a diagram of the isolation between the first port P1 and the second port P2 of the splitter 700 according to another embodiment of the invention. The horizontal axis represents the operation frequency (MHz), and the vertical axis represents the S21 (or S12) parameter between the first port P1 and the second port P2. According to the measurement of FIG. 8, the splitter 700 further has an additional frequency FA other than a central frequency FC. The first reactance circuit 160 and the second reactance circuit 370 are configured to reduce the isolation between the first port P1 and the second port P2 at the central frequency FC, and enhance the isolation between the first port P1 and the second port P2 at the other frequencies, which are adjacent to the central frequency FC but are different from the central frequency FC. The third reactance circuit 780 is configured to reduce the isolation between the first port P1 and the second port P2 at the additional frequency FA. For example, the additional frequency FA may be substantially 1 to 2 times the central frequency FC, such as 1.5 times the central frequency FC. The aforementioned central frequency FC and additional frequency FA are adjustable according to different requirements, and they are not limited to 1 GHz and 1.5 GHz. In some embodiments, the third inductor L3 and the third capacitor C3 are set according to the equations (6) and (7).

$$FA = \frac{1}{2\pi} \cdot \frac{1}{\sqrt{L3 \cdot C3}} \quad (6)$$

$$L3 \cdot C3 \neq L2 \cdot C2 = L1 \cdot C1 \quad (7)$$

where "FA" represents the additional frequency FA, "$\pi$" represents the circular constant, "L3" represents the inductance of the third inductor L3, "C3" represents the capacitance of the third capacitor C3, "L2" represents the inductance of the second inductor L2, "C2" represents the capacitance of the second capacitor C2, "L1" represents the inductance of the first inductor L1, and "C1" represents the capacitance of the first capacitor C1.

With such a design, the first reactance circuit 160 and the second reactance circuit 370 have the same resonant frequency, but the third reactance circuit 780 has a different resonant frequency. When the first reactance circuit 160 is coupled in series with the second reactance circuit 370, the isolation becomes higher at frequencies other than the central frequency FC. In addition, when the third reactance circuit 780 is coupled in parallel with the first reactance circuit 160 and the second reactance circuit 370, the isolation becomes lower at both the central frequency FC and the additional frequency FA. Therefore, the splitter 700 can provide both of higher frequency selectivity and larger transmission bandwidth. Other features of the splitter 700 of FIG. 7 are similar to those of the splitter 300 of FIG. 3. Accordingly, the two embodiments can achieve similar levels of performance.

Figure 9:
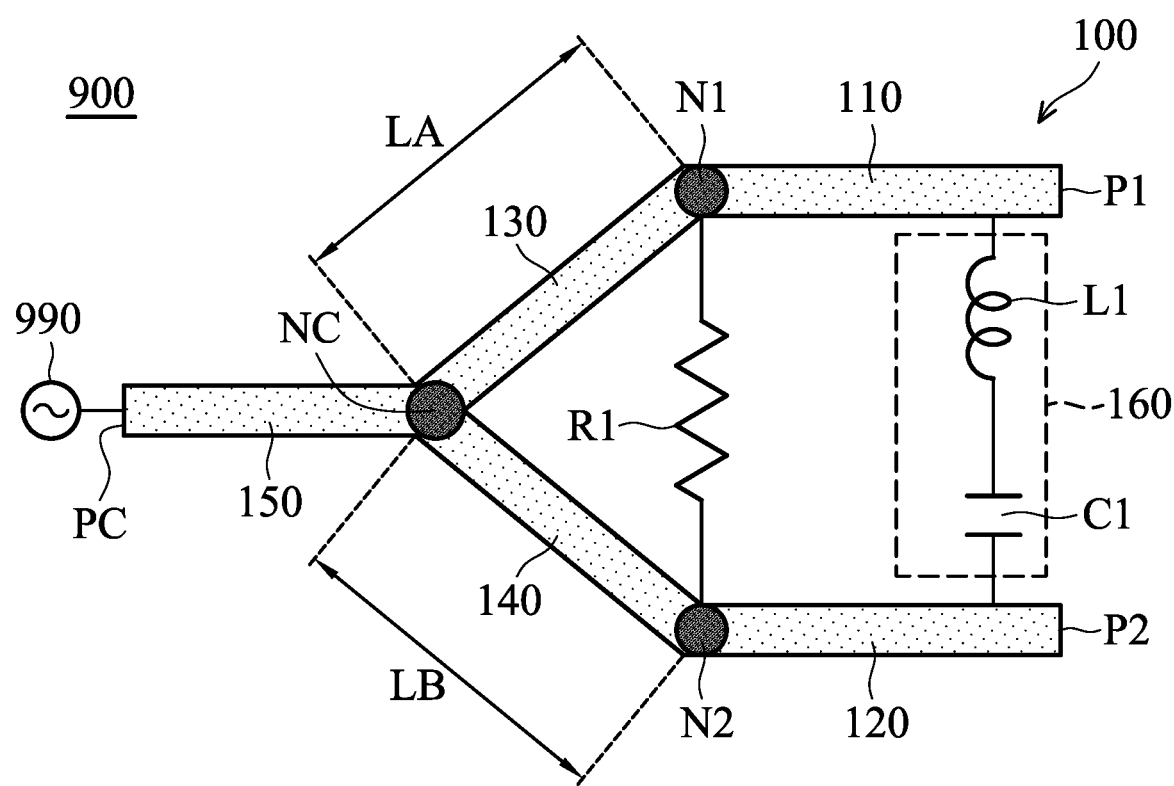
FIG. 9 is a diagram of an electronic device according to an embodiment of the invention.

FIG. 9 is a diagram of an electronic device 900 according to an embodiment of the invention. In the embodiment of FIG. 9, the electronic device 900 includes the splitter 100 and a signal source 990. The common port PC of the splitter 100 is coupled to the signal source 990, so as to receive a variety of signals from the signal source 990. It should be noted that the splitter 100 of the electronic device 900 may be replaced with the splitter 300 of FIG. 3, the splitter 500 of FIG. 5, or the splitter 700 of FIG. 7. Other features of the electronic device 900 of FIG. 9 are similar to those of the splitters 100, 300, 500, and 700 of FIGS. 1, 3, 5, and 7. Accordingly, these embodiments can achieve similar levels of performance.

The invention proposes a novel splitter. By adding the design of reactance circuit, the isolation and the insertion loss between the first port and the second port of the splitter are significantly reduced at the central frequency. For some specific applications, the proposed splitter of the invention can effectively enhance the design flexibility and the system reliability. For example, the proposed splitter may be applicable to a TV (Television) system, in which the common port of the splitter may be coupled to a TV source, the first port of the splitter may be coupled to a MoCA (Multimedia Over Coax Alliance) signal source, and the second port of the splitter may be coupled to a STB (Set-up Box). With such a design, if the TV source cannot provide any MoCA signal, the MoCA signal of the MoCA signal source can be transmitted from the first port to the second port of the splitter, and it can be finally transmitted to the STB. However, the invention is not limited to the above. In other embodiments, the splitter of the invention can be applicable to a variety of systems which need to reduce isolation between output ports at a specific frequency.

Note that the above element shapes and element parameters are not limitations of the invention. A designer can fine-tune these settings or values according to different requirements. It should be understood that the splitter and electronic device of the invention are not limited to the configurations of FIGS. 1-9. The invention may merely include any one or more features of any one or more embodiments of FIGS. 1-9. In other words, not all of the features displayed in the figures should be implemented in the splitter and electronic device of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A splitter with a common port, a first port, and a second port, comprising:
    a common transmission line, coupled between the common port and a common node;
    a first transmission line, coupled between the first port and a first node;
    a second transmission line, coupled between the second port and a second node;
    a third transmission line, coupled between the common node and the first node;
    a fourth transmission line, coupled between the common node and the second node;
    a resistor, coupled between the first node and the second node; and
    a first reactance circuit, coupled between the first node and the second node, wherein the first reactance circuit comprises a first inductor and a first capacitor coupled in series, but the first reactance circuit does not comprise any resistor;
    wherein the splitter operates at a central frequency, and the first reactance circuit is configured to reduce isolation between the first port and the second port at the central frequency.

2. The splitter as claimed in claim 1, wherein the first inductor and the first capacitor are set according to the following equation:

$$FC = \frac{1}{2\pi} \cdot \frac{1}{\sqrt{(L1 \cdot C1)}}$$

wherein FC represents the central frequency, π represents a circular constant, L1 represents an inductance of the first inductor, and C1 represents a capacitance of the first capacitor.

3. The splitter as claimed in claim 1, wherein a length of each of the third transmission line and the fourth transmission line is equal to 0.25 wavelength of the central frequency.

4. The splitter as claimed in claim 1, wherein each of the common transmission line, the first transmission line, and the second transmission line has a predetermined impedance value.

5. The splitter as claimed in claim 4, wherein an impedance value of each of the third transmission line and the fourth transmission line is √2 times the predetermined impedance value.

6. The splitter as claimed in claim 4, wherein a resistance of the resistor is 2 times the predetermined impedance value.

7. The splitter as claimed in claim 1, further comprising:
a second reactance circuit, wherein the second reactance circuit comprises a second inductor and a second capacitor coupled in series, but the second reactance circuit does not comprise any resistor.

8. The splitter as claimed in claim 7, wherein the second reactance circuit and the first reactance circuit are coupled in series between the first node and the second node.

9. The splitter as claimed in claim 8, wherein the second reactance circuit is configured to increase isolation between the first port and the second port at other frequencies adjacent to the central frequency.

10. The splitter as claimed in claim 8, wherein the second inductor and the second capacitor are set according to the following equation:

L2·C2=L1·C1 wherein L2 represents an inductance of the second inductor, C2 represents a capacitance of the second capacitor, L1 represents an inductance of the first inductor, and C1 represents a capacitance of the first capacitor.

11. The splitter as claimed in claim 8, further comprising:
a third reactance circuit, coupled between the first node and the second node, wherein the third reactance circuit comprises a third inductor and a third capacitor coupled in series, but the third reactance circuit does not comprise any resistor.

12. The splitter as claimed in claim 11, wherein the third reactance circuit causes the splitter to further operate at an additional frequency, and the third inductor and the third capacitor are set according to the following equation:

$$FA = \frac{1}{2\pi} \cdot \frac{1}{\sqrt{(L3 \cdot C3)}}$$

wherein FA represents the additional frequency, π represents a circular constant, L3 represents an inductance of the third inductor, and C3 represents a capacitance of the third capacitor.

13. The splitter as claimed in claim 7, wherein the second reactance circuit and the first reactance circuit are coupled in parallel between the first node and the second node.

14. The splitter as claimed in claim 13, wherein the second reactance circuit causes the splitter to further operate at an additional frequency, and the second inductor and the second capacitor are set according to the following equation:

$$FA = \frac{1}{2\pi} \cdot \frac{1}{\sqrt{(L2 \cdot C2)}}$$

wherein FA represents the additional frequency, π represents a circular constant, L2 represents an inductance of the second inductor, and C2 represents a capacitance of the second capacitor.

15. An electronic device, comprising:
a signal source; and
a splitter, having a common port, a first port, and a second port, wherein the common port is coupled to the signal source, and the splitter comprises:
a common transmission line, coupled between the common port and a common node;
a first transmission line, coupled between the first port and a first node;
a second transmission line, coupled between the second port and a second node;
a third transmission line, coupled between the common node and the first node;
a fourth transmission line, coupled between the common node and the second node;
a resistor, coupled between the first node and the second node; and
a first reactance circuit, coupled between the first node and the second node, wherein the first reactance circuit comprises a first inductor and a first capacitor coupled in series, but the first reactance circuit does not comprise any resistor;
wherein the splitter operates at a central frequency, and the first reactance circuit is configured to reduce isolation between the first port and the second port at the central frequency.

16. The electronic device as claimed in claim 15, wherein the splitter further comprises:
a second reactance circuit, wherein the second reactance circuit comprises a second inductor and a second capacitor coupled in series, but the second reactance circuit does not comprise any resistor.

17. The electronic device as claimed in claim 16, wherein the second reactance circuit and the first reactance circuit are coupled in series between the first node and the second node.

* * * * *